(12) United States Patent
Minzoni (10) Patent No.: US 7,250,801 B2
(45) Date of Patent: Jul. 31, 2007

(54) DIFFERENTIAL DUTY CYCLE RESTORATION

(75) Inventor: Alessandro Minzoni, Morrisville, NC (US)

(73) Assignee: Infineon Technologies AG, Munich (DE)

( * ) Notice: Subject to any disclaimer, the term of this patent is extended or adjusted under 35 U.S.C. 154(b) by 148 days.

(21) Appl. No.: 11/211,824

(22) Filed: Aug. 25, 2005

(65) Prior Publication Data

US 2007/0046329 A1 Mar. 1, 2007

(51) Int. Cl.
*H03K 3/017* (2006.01)
(52) U.S. Cl. ....................... 327/175; 327/172
(58) Field of Classification Search .................... None
See application file for complete search history.

(56) References Cited

U.S. PATENT DOCUMENTS

| | | | |
|---|---|---|---|
| 5,614,855 A * | 3/1997 | Lee et al. | 327/158 |
| 6,169,434 B1 * | 1/2001 | Portmann | 327/175 |
| 6,570,944 B2 * | 5/2003 | Best et al. | 375/355 |
| 7,116,143 B2 * | 10/2006 | Deivasigamani et al. | 327/149 |

* cited by examiner

*Primary Examiner*—Tuan Lam
(74) *Attorney, Agent, or Firm*—Patterson & Sheridan, L.L.P.

(57) ABSTRACT

Embodiments of the invention provide methods and apparatuses for restoring a duty cycle of a complementary output signal pair. In one embodiment, the output signal pair is brought in phase with a complementary input signal pair by delaying a complementary intermediate signal pair from which the output signal pair is generated. The intermediate signal pair is switched to a first logic state in response to detecting a crossing point between rising and falling signals of the output signal pair. The intermediate signal pair is switched to a second logic state in response to detecting a crossing point between rising and falling signals of the input signal pair.

24 Claims, 10 Drawing Sheets

DIFFERENTIAL DUTY CYCLE RESTORATION

BACKGROUND OF THE INVENTION

1. Field of the Invention

The invention generally relates to differential signals, and, more particularly, to duty restoration of differential clock signals.

2. Description of the Related Art

Delay locked loops (DLL) are utilized in a wide variety of integrated circuit (IC) devices to synchronize output signals with periodic input signals. In other words, the objective of the DLL is to adjust a phase difference between the input and output signals near zero, for example, to align rising or falling edges of the input and output signals.

Figure 1:
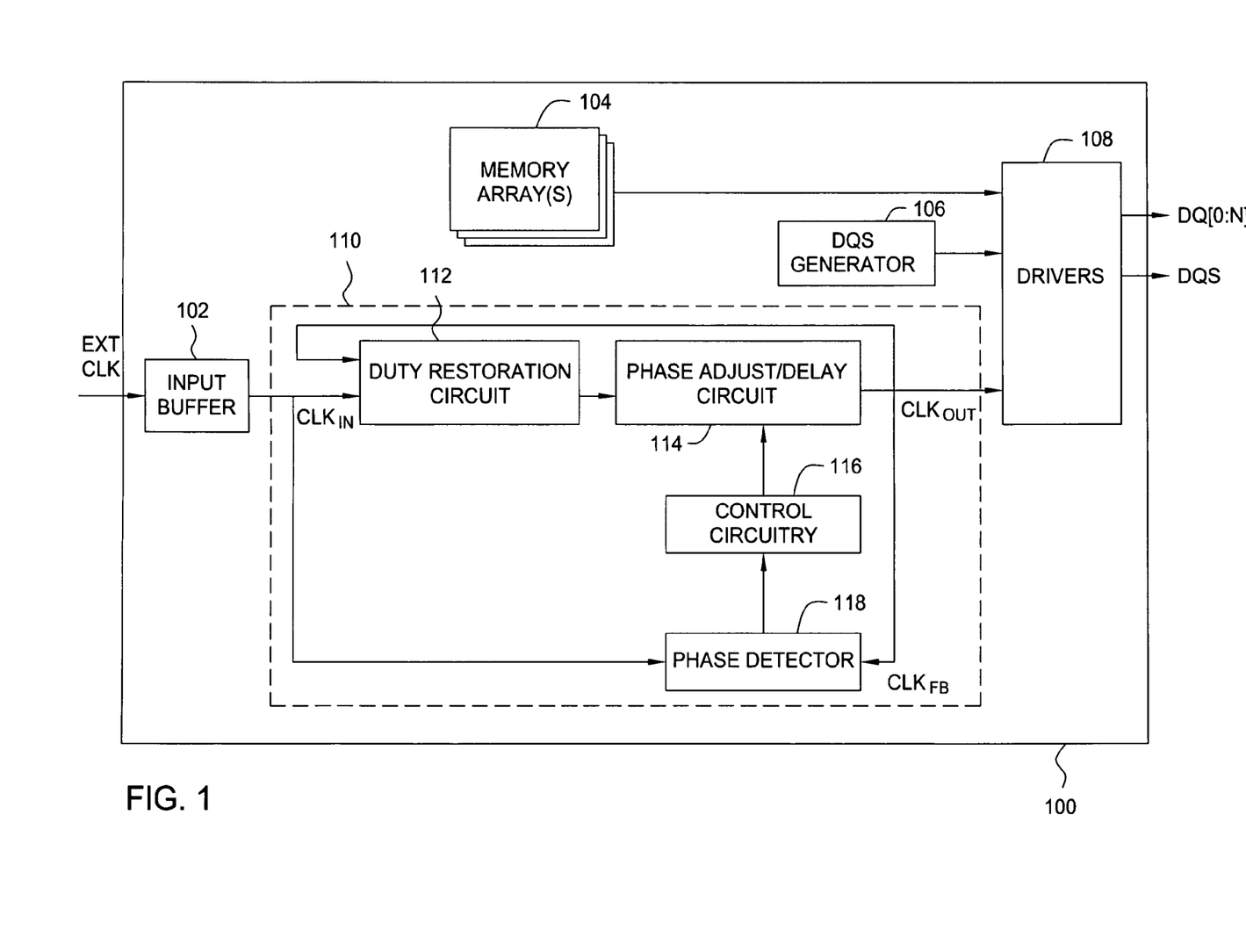
FIG. 1 is a block diagram depicting an exemplary dynamic random access memory (DRAM) device 100 utilizing a delay locked loop (DLL) circuit.

FIG. 1 illustrates an exemplary dynamic random access memory (DRAM) device 100 utilizing a delay locked loop (DLL) circuit 110. A typical DRAM specification is that data from memory arrays 104 be available on output lines DQ[0:N] in conjunction with the rising edge (and falling edge in double data rate devices) of an externally supplied clock signal (EXT CLK). In some cases, the DRAM 100 may supply a data strobe signal (DQS) controlled, for example by DQS generator 106. Typically, the DQS signal should also be synchronized with EXT CLK, thus indicating the data is available.

The DLL circuit 110 may be used to synchronize the DQS and DQ signals with the EXT CLK signal through the introduction of an artificial delay of EXT CLK. Thus, the DLL circuit 110 may be used to increase the valid output data window by synchronizing the output of data with both the rising and falling edges of an output clock $CLK_{OUT}$ applied to the driver circuits 108.

As illustrated, the DLL circuit 110 may include duty restoration circuitry 112, phase adjust/delay circuitry 114 (referred to generally as delay circuitry 114), control circuitry 116, and a phase detector 118.

The phase detector 118 may be used to synchronize the externally received clock signal with DQS by comparing the $CLK_{IN}$ signal to a feedback clock signal $CLK_{FB}$ signal using a feedback loop. To synchronize the $CLK_{IN}$ and $CLK_{FB}$ signals, the phase detector 118 may compare the phase of $CLK_{FB}$ to $CLK_{IN}$ and generate a signal to the control circuitry 116. The control circuitry 116 may output control signals to the delay circuitry 114 which may use the control signals to properly align the phases of $CLK_{IN}$ and $CLK_{FB}$.

The EXT CLK may pass through one or more electrical connections and circuits (e.g., input buffer 102) before being received by the DLL circuit 100 as the $CLK_{IN}$ signal. The DLL circuit 110 may have duty restoration circuitry 112 for restoring a duty cycle of the $CLK_{OUT}$ signal. A duty cycle is the ratio of the on-time of a signal to the period of the signal. Thus, the duty cycle of a signal is the percentage of time that the signal is asserted to a high logic level. To output data accurately from the memory device 100, it may be desired that the $CLK_{OUT}$ signal have a duty cycle of 50%, such that the $CLK_{OUT}$ signal is asserted to a high logic level for half of the $CLK_{OUT}$ period and asserted to a low logic level for the other half of the $CLK_{OUT}$ period.

However, in some cases, the duty cycle of the $CLK_{IN}$ signal may be altered as it passes through the delay circuitry 114 and is output as the $CLK_{OUT}$ signal. For example, the delay circuitry may respond differently to rising and falling edges of the clock signals, such that the rise time ($t_{RISE}$) of a signal passing through the circuit does not equal the fall time ($t_{FALL}$) of a signal passing through the circuit. As a result, the rising and falling edges of the signals may be delayed by differing amounts. Thus, the duty restoration circuitry 112 may be used to restore the duty cycle of the $CLK_{OUT}$ signal.

As depicted, the clock signals $CLK_{IN}$, $CLK_{OUT}$, and $CLK_{FB}$ may all be signals which are delivered on a single line. In some cases, signals delivered on a single line may be subject to noise from other nearby lines (referred to as cross-talk), from noise in driver circuitry used to drive the signals, or from other sources, such as fluctuations in a power supply used to drive the signal. Because such signals are typically measured as absolute voltages with respect to a ground voltage, noise may distort the signals and cause the signals to be read incorrectly. In a low power, high speed memory device, such noise may limit performance of the memory device.

To overcome the performance limitations caused by signal noise, complementary signal pairs (also referred to as differential signal pairs) may be utilized by the memory device 100. A complementary signal pair is a signal and its complement (i.e., a signal and the inverse of the signal). Complementary signals may have greater immunity to noise than normal signals because a complementary signal is measured by determining a difference between two voltages (the signal and its complement). If the measured difference is positive, the signal is positive, and if the measure difference is negative, the signal is negative. Because both the signal and its complement are presumably affected in the same manner by noise in the circuit (e.g., both signals are distorted by a like amount), the noise in the complementary signal pair will cancel when the signal and its complement are compared relative to each other.

Thus, by using complementary signals for $CLK_{IN}$, $CLK_{OUT}$, and $CLK_{FB}$, the performance of the memory device 100 may be improved. However, as described above, the duty cycle of the clock signals may be distorted by circuitry in the memory device 100, such as the delay circuitry 114. While the duty restoration circuitry 112 described above may be used to restore the duty cycle of a single clock signal, conventional duty restoration circuits are limited to single-ended signals and are not used in restoring complementary signal pairs.

Accordingly, what is needed are methods and circuits for restoring the duty cycle of a complementary signal pair.

SUMMARY OF THE INVENTION

Embodiments of the invention generally provide methods and circuits for restoring the duty cycle of a complementary signal pair.

One embodiment provides a method of restoring a duty cycle of a complementary output signal pair. The output signal pair is brought in phase with a complementary input signal pair by delaying a complementary intermediate signal pair from which the output signal pair is generated. The intermediate signal pair is switched to a first logic state in response to detecting a crossing point between rising and falling signals of the output signal pair. The intermediate signal pair is switched to a second logic state in response to detecting a crossing point between rising and falling signals of the input signal pair.

In another embodiment, a circuit is provided. The circuit includes an adjustable delay circuit configured to generate a complementary output signal pair from a complementary intermediate signal pair by delaying the complementary intermediate signal pair and phase adjust circuitry configured to bring the output signal pair in phase with a complementary input signal pair by adjusting the delay of the adjustable delay circuit. The circuit also includes control circuitry configured to switch the intermediate signal pair to a first logic state in response to detecting a crossing point between rising and falling signals of the output signal pair and switch the intermediate signal pair to a second logic state in response to detecting a crossing point between rising and falling signals of the input signal pair.

Another embodiment provides a circuit which includes means for delaying configured to generate a complementary output signal pair from a complementary intermediate signal pair by delaying the complementary intermediate signal pair and means for adjusting a phase configured to bring the output signal pair in phase with a complementary input signal pair by adjusting the delay of the means for delaying. The circuit also includes means for controlling configured to switch the intermediate signal pair to a first logic state in response to detecting a crossing point between rising and falling signals of the output signal pair and switch the intermediate signal pair to a second logic state in response to detecting a crossing point between rising and falling signals of the input signal pair.

Another embodiment provides a method for restoring the duty cycle of a complementary signal pair. The method includes amplifying a first complementary signal pair with a first differential amplifier and amplifying a second complementary signal pair with a second differential amplifier. The amplified first complementary signal pair is latched in conjunction with detecting a rising edge crossing point of a non-delayed version of the first complementary signal pair, wherein a high logic value and a low logic value are stored for a first and second signal of a complementary output signal pair, respectively. The amplified second complementary signal pair is latched in conjunction with detecting a rising edge crossing point of a non-delayed version of the second complementary signal pair, wherein the high logic value is stored for the first signal and the low logic value is stored for the second signal.

One embodiment of the invention provides a differential duty restoration circuit having a first differential amplifier configured to amplify a first complementary signal pair in conjunction with detecting a rising edge crossing point of a non-delayed version of the first complementary signal pair and a second differential amplifier configured to amplify a second complementary signal pair in conjunction with detecting a rising edge crossing point of a non-delayed version of the second complementary signal pair. The differential duty restoration circuit also includes a latch configured to output a stored complementary output signal pair wherein the complementary output signal pair comprises a first output signal and a complement of the first output signal. The differential duty restoration circuit also includes control circuitry configured to enable the latch to store a complementary value pair output by the first differential amplifier, wherein a high logic value is stored for the output signal and a low logic value is stored for the complement of the output signal. The control circuitry is also configured to enable the latch to store a complementary value pair output by the second differential amplifier, wherein the low logic value is stored for the output signal and the high logic value is stored for the complement of the output signal.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Embodiments of the invention generally provide methods and apparatuses for restoring a duty cycle of a complementary output signal pair. In one embodiment, the output signal pair is brought in phase with a complementary input signal pair by delaying a complementary intermediate signal pair from which the output signal pair is generated. The intermediate signal pair is switched to a first logic state in response to detecting a crossing point between rising and falling signals of the output signal pair. The intermediate signal pair is switched to a second logic state in response to detecting a crossing point between rising and falling signals of the input signal pair. By bringing the complementary input and output signal pairs into phase and controlling the state change of the intermediate signal pair with both complementary signals, the duty cycle of the complementary output signal may be maintained at a desired level.

While described below with respect to restoring the duty cycle of complementary signal pairs within a delay locked loop of a memory device, embodiments of the invention may be utilized to restore a duty cycle in any circuit which utilizes complementary signals. Such circuits may include processor circuits which utilize embedded memory devices on a single chip (systems-on-a-chip, or SOCs) as well as any other circuit, including circuits unrelated to memory or memory devices.

Furthermore, complementary signal pairs may also be referred to as signal pairs, differential signals, differential pair signals, or differential signal pairs. Where a given signal of a complementary is described as rising, it is understood that the complementary signal is falling and vice versa.

Overview of a DLL Circuit Which Utilizes Differential Duty Restoration

Figure 2:
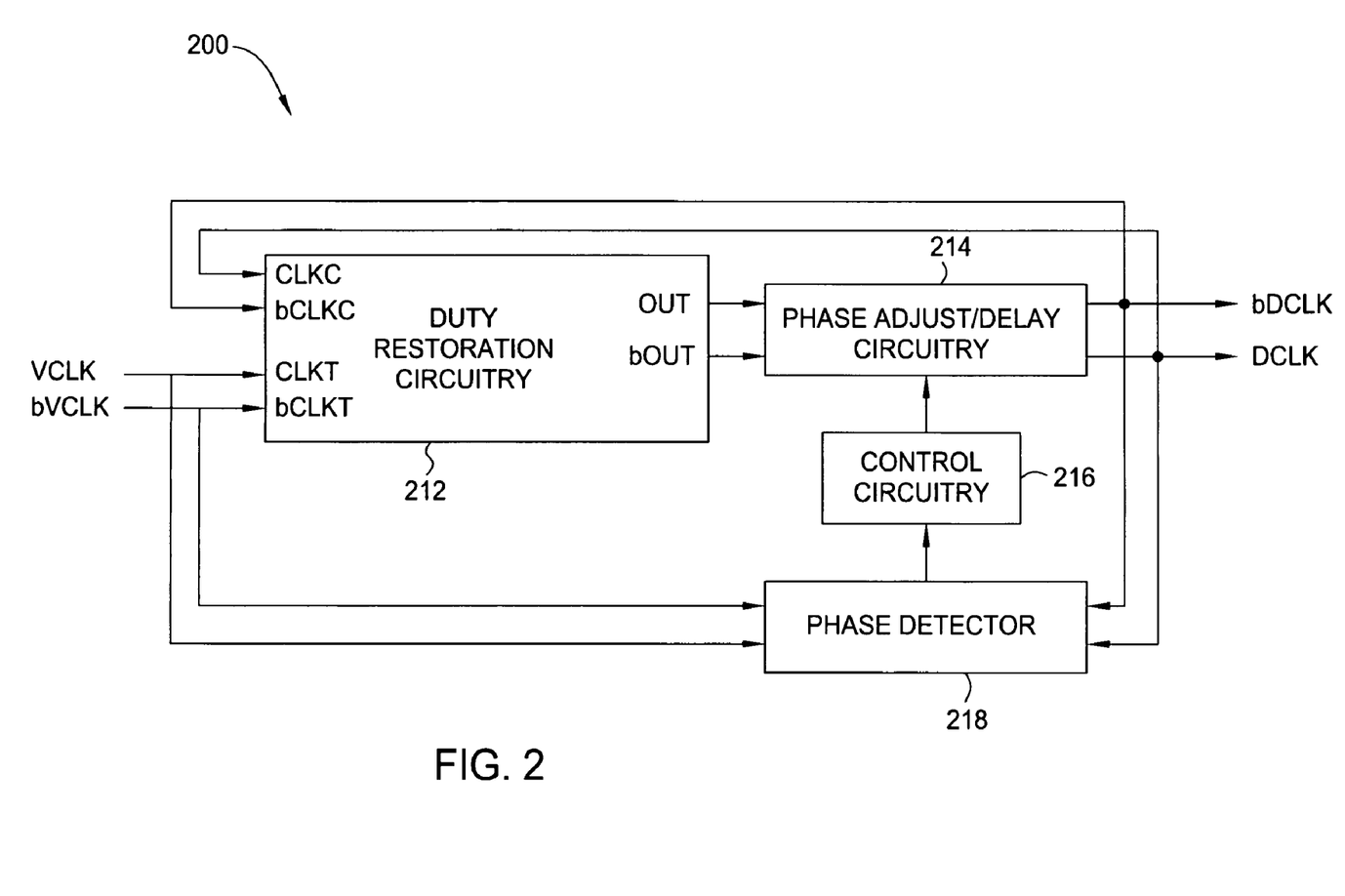
FIG. 2 is a block diagram depicting a DLL Circuit which utilizes a differential duty restoration circuit according to one embodiment of the invention.

FIG. 2 is a block diagram depicting a DLL Circuit 200 which utilizes a differential duty restoration circuit 212 according to one embodiment of the invention.

The input into the DLL circuit 200 may be the complementary signal pair VCLK and bVCLK (the 'b' in front of a signal denotes its complement). Phase detector circuitry 218 may measure a phase difference between a complementary output signal pair (DCLK and bDCLK) of the DLL circuit 200 and the complementary input signal pair VCLK and bVCLK. Based on the measured phase difference (if any), the phase detector 218 may assert a signal to control circuitry 216 which may utilize the measured phase difference to adjust one or more control signals issued to the phase adjust/delay circuitry 214 (referred to herein as delay circuitry 214). Based on the control signals issued by the control circuitry 216, the delay circuitry 214 may adjust a phase of the complementary output signals DCLK and bDCLK, such that a phase difference between VCLK/bVCLK and DCLK/bDCLK is reduced or eliminated.

According to one embodiment of the invention, duty restoration circuit 212 may be used to restore the duty cycle of DCLK/bDCLK (e.g., bring the duty cycle of each closer to 50%). According to one embodiment of the invention, the inputs to the duty restoration circuit 212 may include the complementary input signals VCLK/bVCLK and the complementary output signals DCLK/bDCLK. The output of the duty restoration circuit 212 may be a complementary signal pair (OUT/bOUT) which may be the input to the delay circuitry 214.

Figure 3:
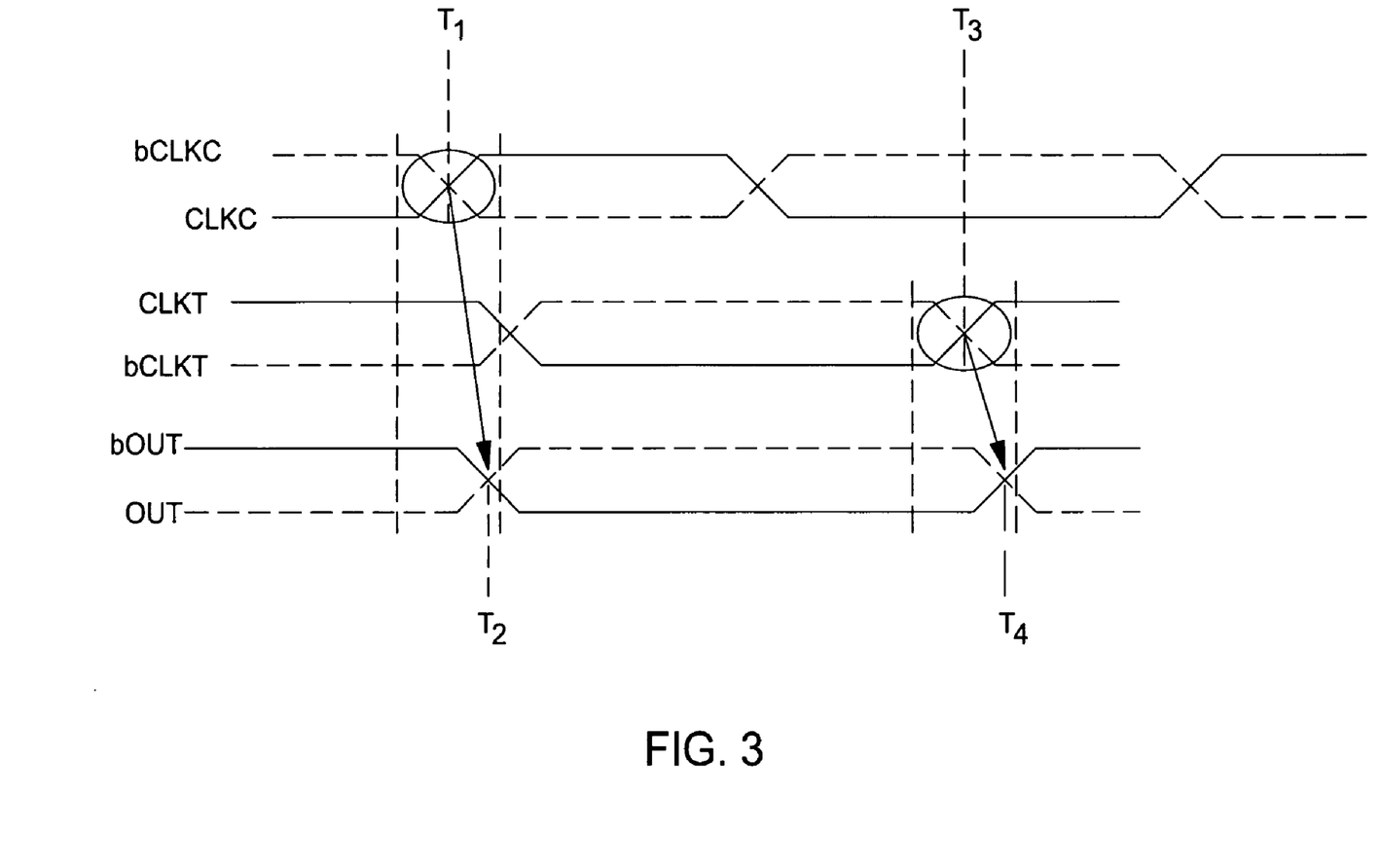
FIG. 3 is a timing diagram depicting complementary input signals issued to a duty restoration circuit and a complementary output signal pair resulting from the complementary input signals according to one embodiment of the invention.

FIG. 3 is a timing diagram depicting complementary input signals (CLKC/bCLKC and CLKT/bCLKT) issued to the duty restoration circuit 212 and the complementary output signal pair (OUT/bOUT) resulting from the complementary input signals according to one embodiment of the invention.

In one embodiment, the CLKC/bCLKC signals may control when the output signal OUT of the duty restoration circuit 212 is raised and the CLKT/bCLKT signals may control when the output signal OUT of the duty restoration circuit 212 is lowered. Thus, at time T1, the duty restoration circuit 212 may detect a rising CLKC crossing point (in other words, a crossing point of CLKC and bCLKC where CLKC is rising). When the rising CLKC crossing point is detected, the output signal OUT may be raised (at time $T_2$) to a high logic level while the complementary output signal bOUT may be lowered. Later, at time $T_3$, the duty restoration circuit 212 may detect a rising CLKT crossing point and lower the output signal OUT (while raising the complementary signal bOUT) at time $T_4$.

As described above with respect to FIG. 2, phase detector 218 reduces and/or eliminates the phase difference between VCLK/bVCLK and DCLK/bDCLK. Because DCLK/bDCLK is fed back such that DCLK/bDCLK produces a rising edge of OUT and such that VCLK/bVCLK produces a falling edge of OUT, and because the phase difference between the signals is reduced and/or eliminated, the duty cycle of DCLK/bDCLK is maintained at or near the desired 50%.

Circuitry designed to implement the duty restoration circuit is now described with respect to FIGS. 4-7.

Overview of the Differential Duty Restoration Circuit

Figure 4:
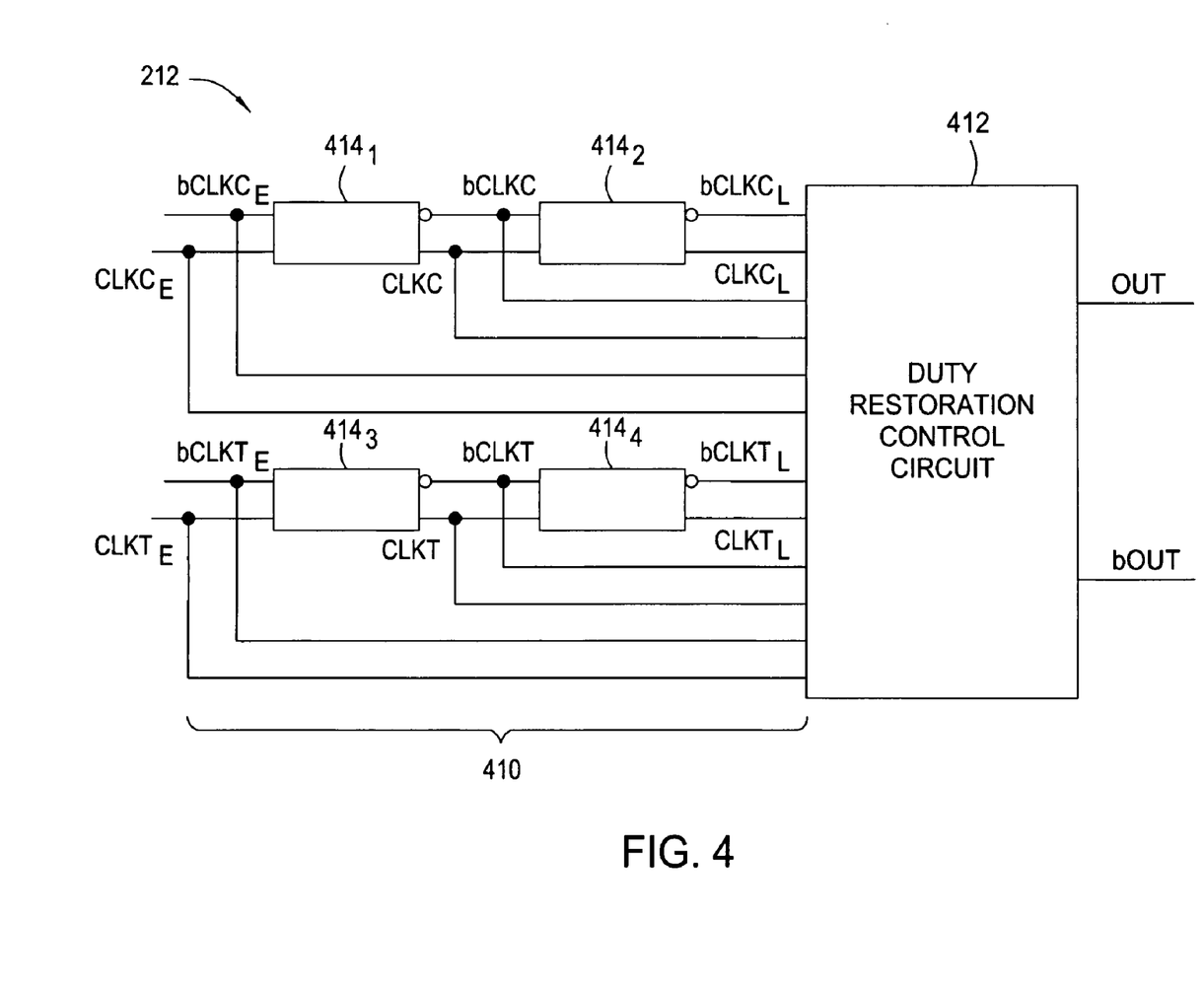
FIG. 4 is a block diagram depicting a differential duty restoration circuit according to one embodiment of the invention.

FIG. 4 is a block diagram depicting a differential duty restoration circuit 212 according to one embodiment of the invention. In one embodiment, the differential duty restoration circuit 212 may contain differential delay circuitry 410 and a duty restoration control circuit 412.

In one embodiment, the differential delay circuitry 410 may be utilized to generate various delayed versions of the complementary input signals CLKC/bCLKC and CLKT/bCLKT. The differential delay circuitry 410 may have multiple differential delay elements $414_1$, $414_2$, $414_3$, $414_4$. Each differential delay element may delay a complementary input signal by a finite amount, producing a delayed version of the complementary input signal. Connections between the differential delay elements $414_1$, $414_2$, $414_3$, $414_4$ may be used to access the complementary signal at the various delayed stages.

Differential delay elements $414_1$ and $414_2$ may be used to generate early, normal, and late versions of the CLKC/bCLKC complementary signals ($CLKC_E$/$bCLKC_E$, CLKC/bCLKC, and $CLKC_L$/$bCLKC_L$, respectively). The initially received signal may be the early signal $CLKC_E$/$bCLKC_E$. The $CLKC_E$/$CLKC_E$ signals may then be passed through delay element $414_1$ to produce the signals CLKC/bCLKC. The CLKC/bCLKC signals may then be passed through delay element $414_2$ to produce the $CLKC_L$/$bCLKC_L$ signals. The early, normal, and late versions of the CLKT/bCLKT complementary signals ($CLKT_E$/$bCLKT_E$, CLKT/bCLKT, and $CLKT_L$/$bCLKT_L$, respectively) may be similarly produced using delay elements $414_3$ and $414_4$.

1. The Basic Differential Structure

Figure 5:
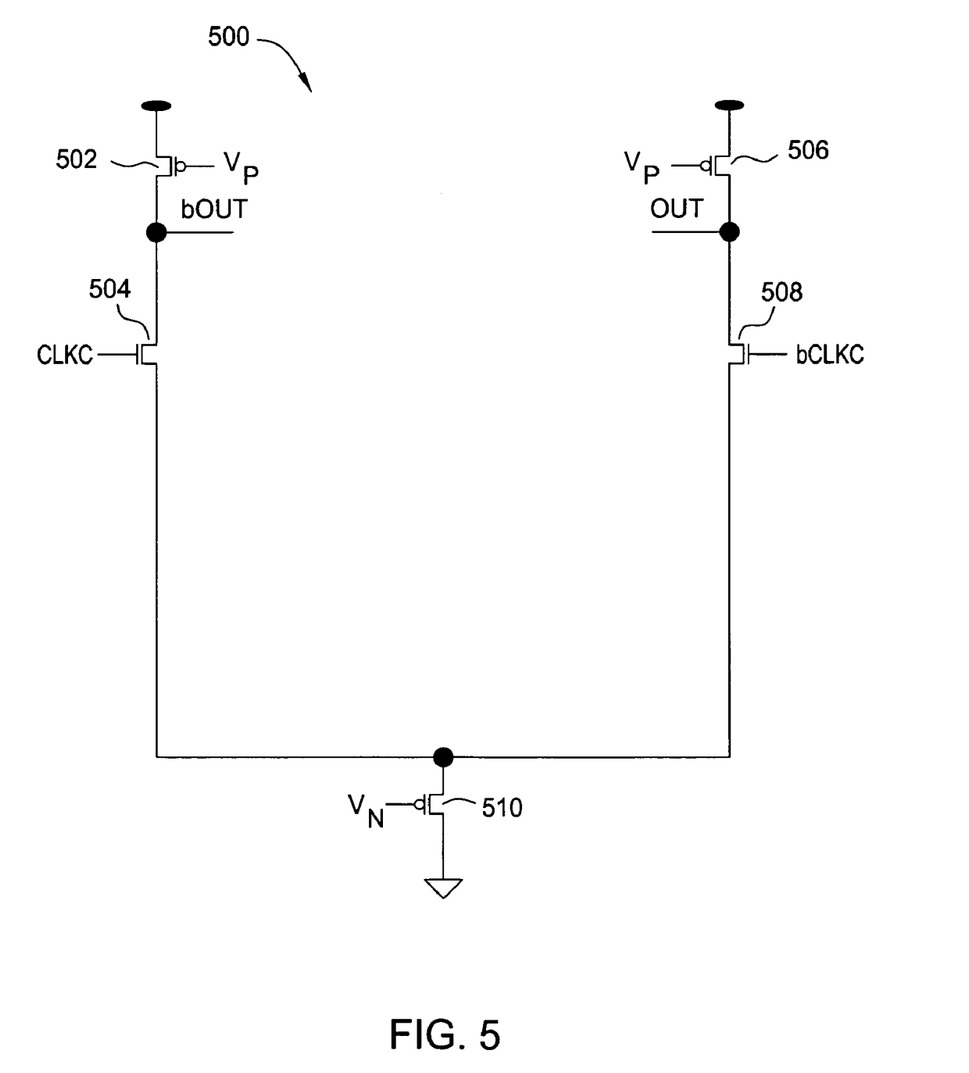
FIG. 5 is a circuit diagram depicting an exemplary differential amplifier which may be utilized by a duty restoration control circuit according to one embodiment of the invention.

According to one embodiment of the invention, a differential amplifier may be used to generate the output signals (OUT/bOUT) for the duty restoration control circuit 412. FIG. 5 is a circuit diagram depicting an exemplary differential amplifier 500 which may be utilized by the duty restoration control circuit 412 according to one embodiment of the invention. The differential amplifier 500 may be used to compare two signals (e.g., CLKC and bCLKC, as depicted) and amplify the difference between them.

For example, if CLKC is a high logic value and bCLKC is a low logic value, NMOS transistor 504 may be turned on by CLKC, thus pulling bOUT down through NMOS transistor 510 which is turned on by a low voltage $V_N$ (and thus acts as a current source). Similarly, NMOS transistor 508 may be turned off by bCLKC, causing the signal OUT to be pulled up through PMOS transistor 506 which is turned on by the high voltage $V_P$ (and thus also acts as a current source).

If, at some time later, CLKC begins to switch to a low logic value and bCLKC begins to switch to a high logic value, NMOS transistor 504 may be turned off, thus allowing bOUT to be pulled up through PMOS transistor 502 which is turned on by the high voltage $V_P$. Similarly, NMOS transistor 508 may be turned on by the rising bCLKC signal, causing the signal OUT to be pulled down through NMOS transistor 510 which is turned on by the high voltage $V_P$ (and thus also acts as a current source).

The differential amplifier depicted in FIG. 5 is merely exemplary. Any differential amplifier including differential amplifiers known to persons of ordinary skill in the art may be utilized with embodiments of the invention.

2. Overview of the Duty Restoration Control Circuit

According to one embodiment of the invention, the duty restoration control circuit 412 utilizes differential amplifiers and switches to mix the early, normal, and late versions of the complementary input signals CLKC/bCLKC and CLKT/bCLKT. In one embodiment, the duty restoration control circuit 412 may use the early versions of the complementary input signals to detect when a rising CLKC crossing point or a rising CLKT crossing point is approaching and may thereby accurately generate the complementary output signal OUT/bOUT.

Figure 6:
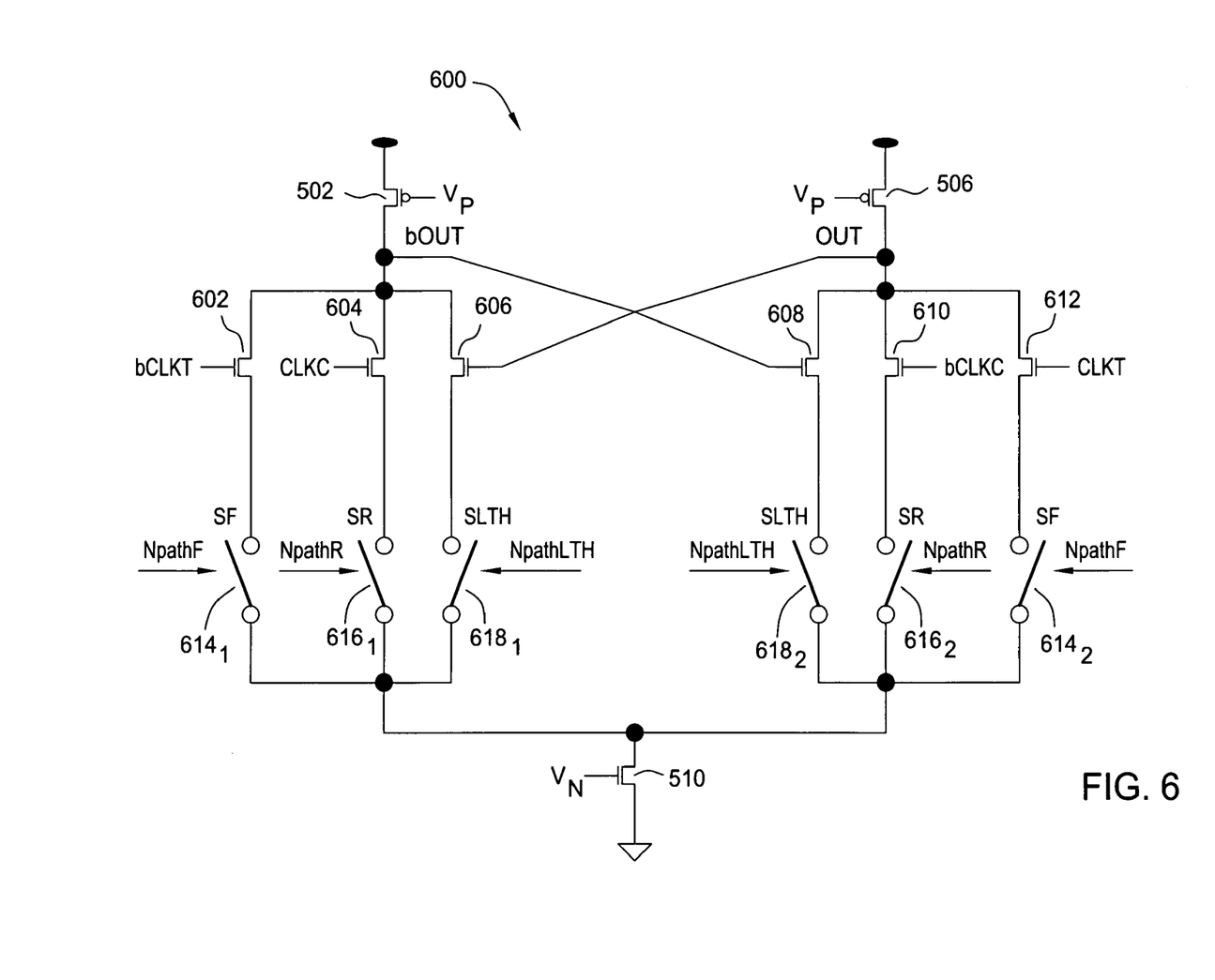
FIG. 6 is a circuit diagram depicting a duty restoration control circuit according to one embodiment of the invention.
Figure 7A:
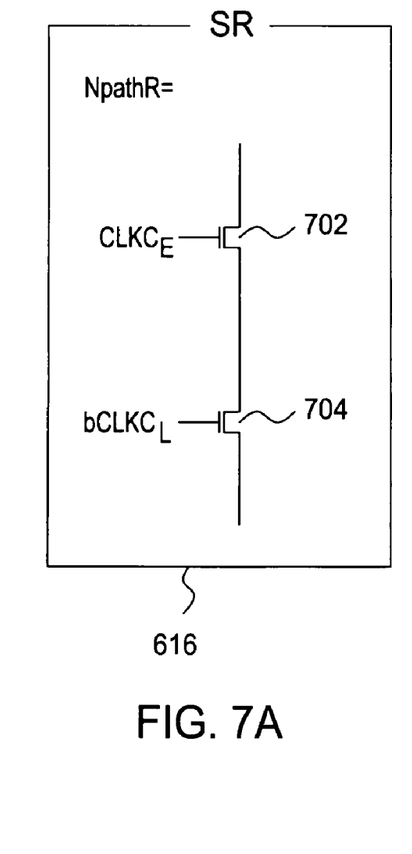
FIGS. 7A-7C are circuit diagrams depicting switches utilized in a duty restoration control circuit according to one embodiment of the invention.
Figure 7B:
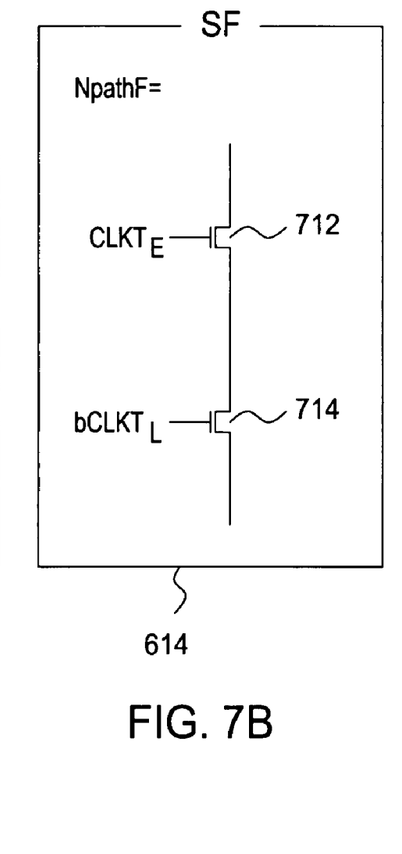
Figure 7C:
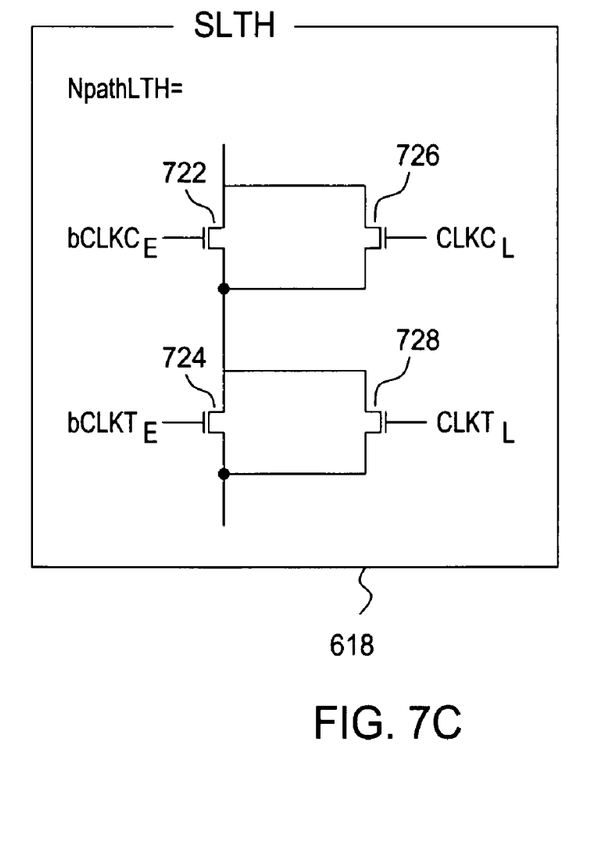

FIG. 6 is a circuit diagram depicting a duty restoration control circuit 600 according to one embodiment of the invention. According to one embodiment of the invention, the duty restoration control circuit 600 may include a latch formed by transistors 606, 608 and switches $618_1$ $618_2$ (labeled SLTH, controlled by signal NpathLTH). The differential duty restoration control circuit 600 may also include a first differential amplifier formed by NMOS transistors 602, 612 and switches $614_1$, $614_2$, (labeled SF, controlled by signal NpathF) as well as a second differential amplifier formed by NMOS transistors 604, 610 and switches $616_1$, $616_2$ (labeled SR, controlled by signal NpathR). FIGS. 7A-7C are circuit diagrams depicting the switches 614, 616, 618 utilized in the duty restoration control circuit 412 according to one embodiment of the invention.

As described below, when a rising CLKC crossing point is detected, the differential amplifier formed by NMOS transistors 604, 610 may assert the output signal OUT (lowering the complementary signal bOUT). The OUT value asserted by the differential amplifier may then be latched by the latch formed by NMOS transistors 606, 608. Later, when a rising CLKT crossing point is detected, the differential amplifier formed by NMOS transistors 602, 612 may lower the output signal OUT (while asserting the complementary signal bOUT). The OUT value lowered by the differential amplifier may then be latched by the latch formed by NMOS transistors 606, 608. Thus, the duty restoration control circuit 600 may correctly generate the desired complementary output signals OUT/bOUT and accurately restore the duty cycle of the complementary output signal DCLK/bDCLK.

2.A Detecting a Rising Edge Crossing Point of CLKC

According to one embodiment of the invention, the differential amplifier formed by NMOS transistors 604, 610 may be enabled by the switch SR $616_1$, $616_2$ when a rising edge crossing point of CLKC is detected. Switches SR $616_1$, $616_2$ may be controlled by the NpathR signal which may be asserted when a rising edge of CLKC is detected, thus closing switch SR 616 and enabling the differential amplifier formed by NMOS transistors 604, 610.

FIG. 7A depicts switch SR 616 according to one embodiment of the invention. SR 616 is controlled by the NpathR signal which detects a rising CLKC crossing point. In one embodiment, NpathR is a composite of two signals, $CLKC_E$ and $bCLKC_L$, such that:

NpathR=$CLKC_E$ and $bCLKC_L$

As depicted in FIG. 7A, SR 616 may be implemented with two NMOS transistors 702, 704 placed in series and controlled by $CLKC_E$ and $bCLKC_L$ respectively. According to one embodiment of the invention, NMOS transistors 702, 704 may be double width transistors, such that the transistors 702, 704 have greater current drive capability than a single width transistor.

Switch SR 616 may only be closed when both the $CLKC_E$ and $bCLKC_L$ signals are asserted. As previously described, $CLKC_E$ is the early version of CLKC and $bCLKC_L$ is the later version of bCLKC. Thus, switch SR 616 may be closed from a time when $CLKC_E$ is asserted (CLKC is rising and bCLKC is falling) until a time when bCLKC is lowered (CLKC has fully switched to a positive value and bCLKC is fully switched to a negative value). Table 1 below depicts the control signals and corresponding state of switch SR 616. A plus (+) after a number indicates that the signal is rising and a minus (−) after a number indicates that the signal is falling.

TABLE 1

| CLKC State | Operation of Switch SR | | | | | |
|---|---|---|---|---|---|---|
|  | CLKC | bCLKC | $CLKC_E$ | $bCLKC_L$ | NpathR | SR |
| Low | 0 | 1 | 0 | 1 | 0 | Off |
| Rising | 0+ | 1− | 1 | 1 | 1 | On |
| High | 1 | 0 | 1 | 0 | 0 | Off |

Referring back to FIG. 6, when switch SR 616 is on and CLKC is rising, the differential amplifier formed by NMOS transistors 604, 610 may be enabled and may drive the duty restoration circuit 212 output signal bOUT downward (due to the current drained by NMOS transistor 510 through open NMOS transistor 604) while driving output signal OUT upward (due to the current supplied by PMOS transistor 506 with NMOS transistor 610 closed). According to one embodiment of the invention, the high logic value output by the differential amplifier formed by NMOS transistors 604, 610 when CLKC is rising may be latched (e.g., saved or stored) by the latch formed by NMOS transistors 606, 608 (described below in greater detail).

2.B Detecting a Rising Edge Crossing Point of CLKT

According to one embodiment of the invention, the differential amplifier formed by NMOS transistors 602, 612 may be enabled by the switches SF $614_1$, $614_2$ when a rising edge crossing point of CLKT is detected. Switches SF $614_1$, $614_2$ may be controlled by the NpathF signal which may be asserted when a rising edge of CLKT is detected, thus closing switches SF $614_1$, $614_2$ and enabling the differential amplifier formed by NMOS transistors 602, 612.

FIG. 7B depicts switch SF 614 according to one embodiment of the invention. SF 614 is controlled by the NpathF signal which detects a rising CLKT crossing point. In one embodiment, NpathF is a composite of two signals, $CLKT_E$ and $bCLKT_L$, such that:

NpathF=$CLKT_E$ and $bCLKT_L$

As depicted in FIG. 7B, SF 614 may be implemented with two NMOS transistors 712, 714 placed in series and controlled by $CLKT_E$ and $bCLKT_L$ respectively. As described with respect to switch SR 616, NMOS transistors 712, 714 may be double width transistors, such that the transistors 712, 714 have greater current drive capability than a single width transistor.

Switch SF 614 may only be closed when both the $CLKT_E$ and $bCLKT_L$ signals are asserted. As previously described, $CLKT_E$ is the early version of CLKT and $bCLKT_L$ is the later version of bCLKT. Thus, switch SF 614 may be closed from a time when $CLKT_E$ is asserted (CLKT is rising and bCLKT is falling) until a time when bCLKT is lowered (CLKT has fully switched to a positive value and bCLKT is fully switched to a negative value). Table 1 below depicts the control signals and corresponding state of switch SF 614. As before, a plus (+) after a number indicates that the signal is rising and a minus (−) after a number indicates that the signal is falling.

TABLE 2

Operation of Switch SF

| CLKT State | CLKT | bCLKT | CLKT$_E$ | bCLKT$_L$ | NpathF | SF |
|---|---|---|---|---|---|---|
| Low | 0 | 1 | 0 | 1 | 0 | Off |
| Rising | 0+ | 1− | 1 | 1 | 1 | On |
| High | 1 | 0 | 1 | 0 | 0 | Off |

Referring back to FIG. 6, when switches SF 614$_1$, 614$_2$ are on and CLKT is rising, the differential amplifier formed by NMOS transistors 602, 612 may be enabled and may drive the duty restoration circuit 212 output signal OUT downward (due to the current drained by NMOS transistor 510 through open NMOS transistor 612) while driving output signal bOUT upward (due to the current supplied by PMOS transistor 502 with NMOS transistor 602 closed). According to one embodiment of the invention, the low logic value output by the differential amplifier formed by NMOS transistors 602, 612 when CLKT is rising may be latched by the latch formed by NMOS transistors 606, 608, now described with respect to FIG. 6 and FIG. 7C.

2.C Latching OUT/bOUT Complementary Output Values

According to one embodiment of the invention, the latch formed by NMOS transistors 606, 608 may store and maintain a value of OUT/bOUT when switches SLTH 618$_1$, 618$_2$ are opened by the NpathLTH signal (e.g., when the NpathLTH signal is low). In one embodiment of the invention, the NpathLTH signal may be lowered each time OUT/bOUT is transitioning (e.g., around a rising CLKC crossing point and around a rising CLKT crossing point). Thus, each time the values of OUT/bOUT are being changed by the differential drivers formed by NMOS transistors 604, 610 and 602, 612 respectively, the values may be latched and output by the duty restoration control circuit 412 until the values of OUT/bOUT are changed again.

During regular operation (e.g., when the latched value is not being changed), the latch formed by NMOS transistors 606, 608 may output a value previously stored in the latch. While the value is being output, switches SLTH 618$_1$, 618$_2$ may be closed. If, for example, a high logic value is stored for OUT and a low logic value is stored for bOUT, the high logic value stored for OUT may open NMOS transistor 606, causing current through NMOS transistor 510 to maintain bOUT at a low logic value. Similarly, the low logic value stored for bOUT may close NMOS transistor 610, causing current flowing through PMOS transistor 506 to maintain OUT at a high logic level. Where bOUT is a high logic level and OUT is a low logic level, bOUT and OUT may similarly maintain each other at their respective high and low logic level. In some cases, the latch configuration where the output of one part of the latch circuit (bOUT) is connected to the input of another part of the latch circuit (NMOS transistor 608 controlling OUT value) and vice versa (where OUT is connected to the NMOS transistor 606 controlling bOUT value) may be referred to as a cross-coupled latch configuration.

According to one embodiment of the invention, when a value stored in the latch is to be changed, switches SLTH 618$_1$, 618$_2$ may be opened. FIG. 7C depicts switch SLTH 618 according to one embodiment of the invention. SLTH 618 is controlled by the NpathLTH signal which detects both a rising CLKC crossing point and a rising CLKT crossing point. When the rising CLKC crossing point or the rising CLKT crossing point is detected, the switch SLTH 618 may be opened. In one embodiment, NpathLTH is a composite of four signals, bCLKC$_E$, CLKC$_L$, bCLKT$_E$, and CLKT$_L$, such that:

NpathLTH=(bCLKC$_E$ AND CLKC$_L$) OR (bCLKT$_E$ AND CLKT$_L$)

As depicted in FIG. 7C, SLTH 618 may be implemented with four NMOS transistors 722, 724, 726, 728. NMOS transistors 724, 728 may be placed in parallel and may be controlled by bCLKT$_E$ and CLKT$_L$ respectively. NMOS transistors 722, 726 may also be placed in parallel and may be controlled by bCLKC$_E$ and CLKC$_L$ respectively. As described with respect to switch SR 616 and SF 618, in one embodiment, NMOS transistors 722, 724, 726, 728 may be double width transistors, such that the transistors 722, 724, 726, 728 have greater current drive capability than a single width transistor.

As previously mentioned, switch SLTH 618 may only be opened when CLKC is transitioning from a low logic level to a high logic level or when CLKT is transitioning from a low logic level to a high logic level.

With respect to the transistors 722, 726 controlled by bCLKC$_E$ and CLKC$_L$, bCLKC$_E$ and CLKC$_L$ are both derived from complementary signals (CLKC/bCLKC), such that one of the signals will typically have a high logic value while the other signal will have a low logic value. Thus, the expression (bCLKC$_E$ AND CLKC$_L$) will typically be true. However, a rising CLKC crossing point will cause bCLKC$_E$ to drop to a low logic level while CLKC$_L$ remains at a low logic level until after CLKC has transitioned to a high logic level. Thus, when both of the signals are at a low logic level, the expression (bCLKC$_E$ AND CLKC$_L$) is false the switch SLTH 618 is closed. The effect of bCLKC$_E$ and CLKC$_L$ on NpathLTH and SLTH, (assuming that (bCLKT$_E$ AND CLKT$_L$)=1) is depicted in Table 3.

TABLE 3

Dependency of Switch SLTH on CLKC/bCLKC

| CLKC State | CLKC | bCLKC | bCLKC$_E$ | CLKC$_L$ | NpathLTH | SLTH |
|---|---|---|---|---|---|---|
| Low | 0 | 1 | 1 | 0 | 1* | On* |
| Rising | 0+ | 1− | 0 | 0 | 0 | Off |
| High | 1 | 0 | 0 | 1 | 1* | On* |

*Assuming (bCLKT$_E$ AND CLKT$_L$) = 1

With respect to the transistors 724, 728 controlled by bCLKT$_E$ and CLKT$_L$, bCLKT$_E$ and CLKT$_L$ are both derived from complementary signals (CLKT/bCLKT), so one of the signals will typically have a high logic value while the other signal will have a low logic value. Thus, the expression (bCLKT$_E$ AND CLKT$_L$) will typically be true. However, a rising CLKT crossing point will cause bCLKT$_E$ to drop to a low logic level while CLKT$_L$ remains at a low logic level until after CLKT has transitioned to a high logic level. Thus, when both of the signals are at a low logic level, the expression (bCLKT$_E$ AND CLKT$_L$) is false the switch SLTH 618 is closed. The effect of bCLKT$_E$ and CLKT$_L$ on NpathLTH and SLTH, (assuming that (bCLKC$_E$ AND CLKC$_L$)=1) is depicted in Table 4.

TABLE 4

Dependency of Switch SLTH on CLKT/bCLKT

| CLKT State | CLKT | bCLKT | bCLKT$_E$ | CLKT$_L$ | NpathLTH | SLTH |
|---|---|---|---|---|---|---|
| Low | 0 | 1 | 1 | 0 | 1* | On* |
| Rising | 0+ | 1− | 0 | 0 | 0 | Off |
| High | 1 | 0 | 0 | 1 | 1* | On* |

*Assuming (bCLKC$_E$ AND CLKC$_L$) = 1)

Thus, as depicted with respect to Tables 3-4 and described above, switch SLTH is opened when either CLKC or CLKT is transitioning to a high logic value and either bCLKC or bCLKT respectively is transitioning to a low logic value (a rising CLKC or CLKT crossing point).

Referring back to FIG. 6, when SLTH is opened the value being output by either of the differential amplifiers (formed by NMOS transistors 602, 612 and 604, 608, respectively) may be latched.

For example, assume the latched values of OUT and bOUT are low and high, respectively. When a rising CLKC crossing point is detected, switches SR 616$_1$, 616$_2$ are closed and switches SLTH 618$_1$, 618$_2$ are opened. When switch SLTH is 618$_2$ is opened, OUT is no longer pulled down by current through NMOS transistor 510 and OUT may accordingly be pulled up by PMOS transistor 506. At the same time, switch SR 616$_2$ may be closed, allowing bOUT to be pulled down by NMOS transistor 510 through NMOS transistor 604 which is turned on by CLKC. After CLKC has transitioned to a high logic value, switches SR 616$_1$, 616$_2$ may be opened and switches SLTH 618$_1$, 618$_2$ may be closed, causing the latch to store and maintain the low value of bOUT and the high value of OUT.

Similarly, when a rising CLKT crossing point is detected, switches SF 614$_1$, 614$_2$ may be closed and switches SLTH 618$_1$, 618$_2$ may be opened. Assuming the previous latched values of OUT and bOUT are high and low, respectively, when switch SLTH is 618, is opened, bOUT is no longer pulled down by current through NMOS transistor 510 and bOUT may accordingly be pulled up by PMOS transistor 502. At the same time, switch SF 614$_2$ may be closed, allowing OUT to be pulled down by NMOS transistor 510 through NMOS transistor 612 which is turned on by CLKT. After CLKT has transitioned to a high logic value, switches SF 614$_1$, 614$_2$ may be opened and switches SLTH 618$_1$, 618$_2$ may be closed, causing the latch to store and maintain the high value of bOUT and the low value of OUT.

3. Process of Restoring the Duty Cycle of the OUT/bOUT Output Signal

Figure 8:
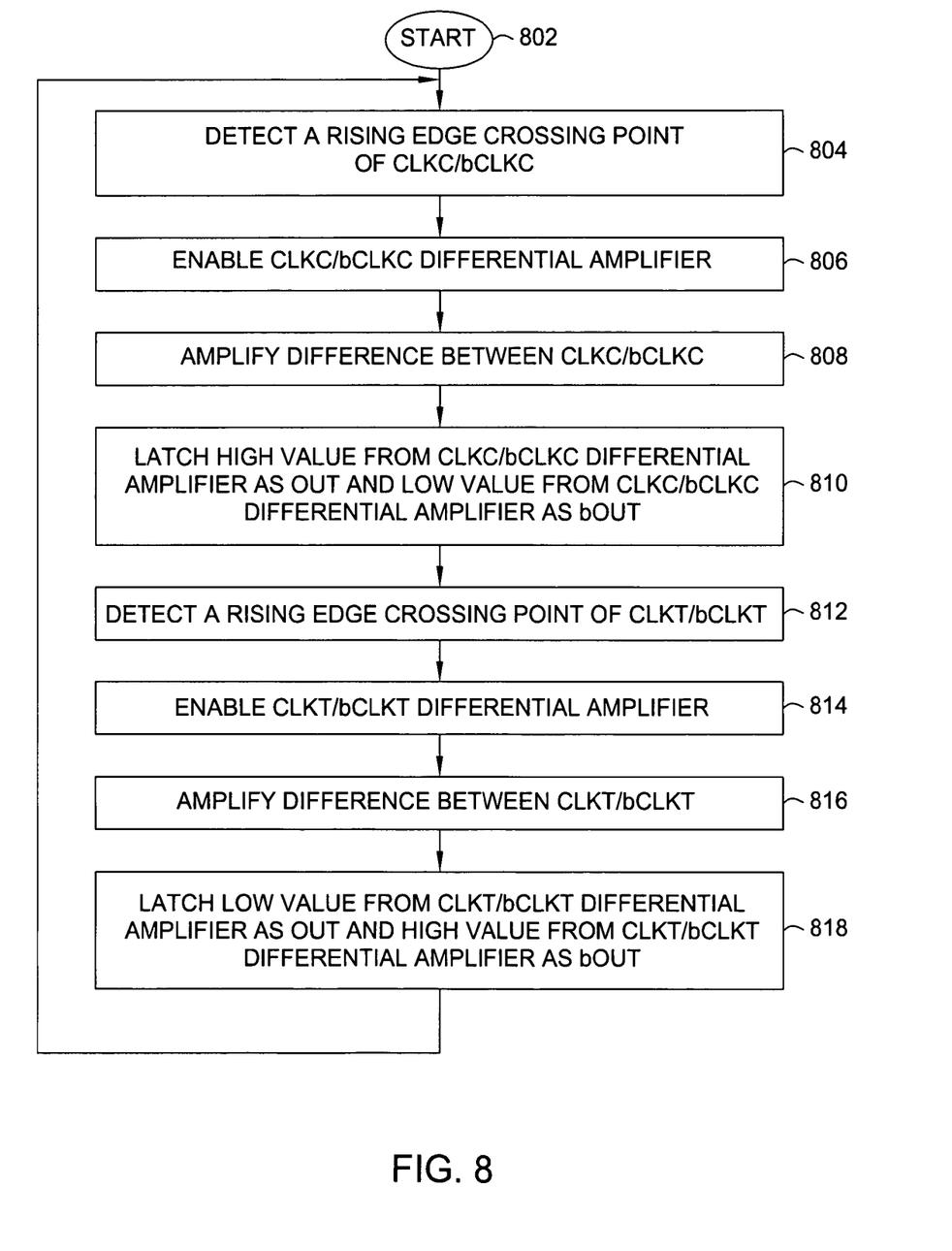
FIG. 8 is a flow diagram depicting a process for restoring the duty cycle of a complementary output signal according to one embodiment of the invention.

FIG. 8 is a flow diagram depicting a process 800 for restoring the duty cycle of a complementary output signal according to one embodiment of the invention. In one embodiment, the process may start at step 802.

At step 804, a rising edge crossing point of CLKC/bCLKC may be detected and at step 806 a differential amplifier which amplifies a difference between CLKC/bCLKC may be enabled, causing the difference between CLKC/bCLKC to be amplified and output by the differential amplifier at step 808. Then, at step 810, the high value from the CLKC/bCLKC differential amplifier may be latched as the OUT value and the low value from the CLKC/bCLKC differential amplifier may by latched as the bOUT value.

Later, at step 812, a rising edge crossing point of CLKT/bCLKT may be detected and at step 814 a differential amplifier which amplifies a difference between CLKT/bCLKT may be enabled, causing the difference between CLKT/bCLKT to be amplified and output by the differential amplifier at step 816. Then, at step 818, the high value from the CLKT/bCLKT differential amplifier may be latched as the bOUT value and the low value from the CLKT/bCLKT differential amplifier may by latched as the OUT value.

According to one embodiment, the process may then continue at step 804, such that the duty cycle of the output cycle OUT/bOUT is constantly maintained at 50% while the memory device 100 is operating.

4. Timing of Signals for Controlling the Duty Restoration Circuit

Figure 9:
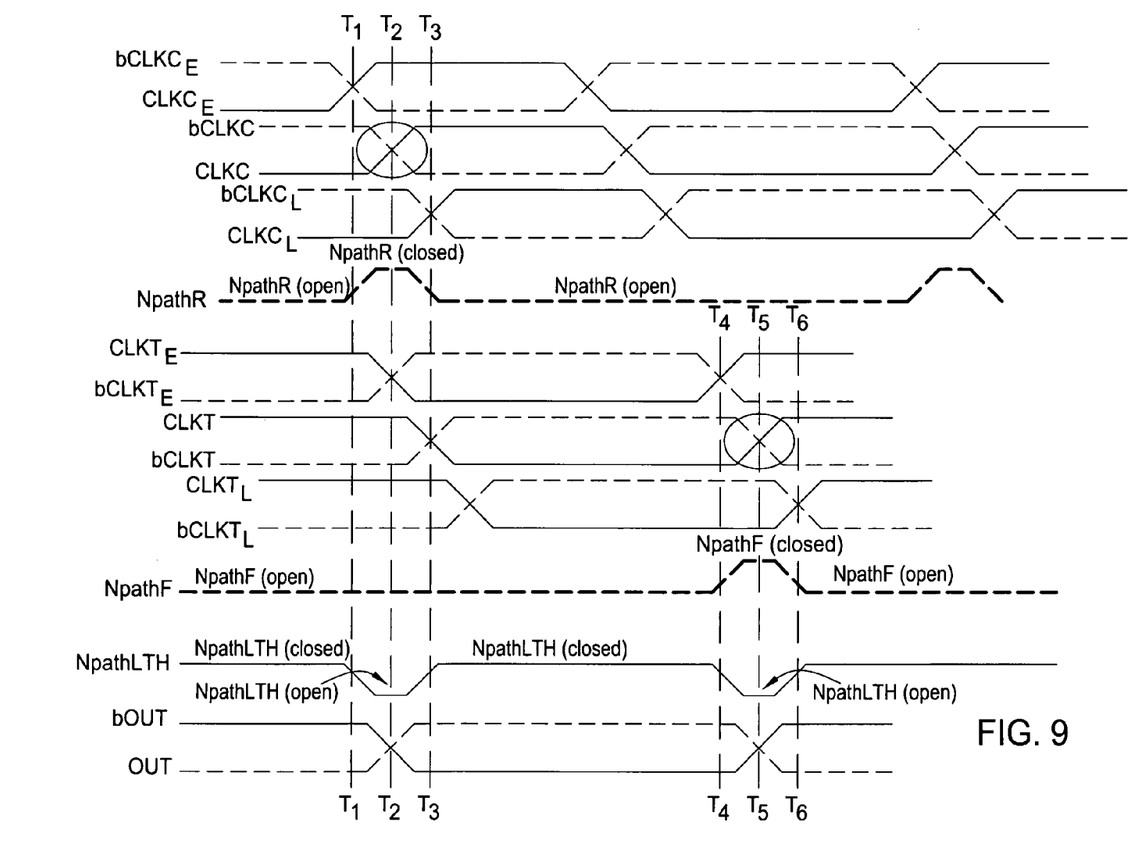
FIG. 9 is a timing diagram depicting complementary input signals issued to a duty restoration circuit and a complementary output signal pair resulting from the complementary input signals according to one embodiment of the invention.

FIG. 9 is a timing diagram depicting the complementary input signals issued to a duty restoration circuit and a complementary output signal pair OUT/bOUT resulting from the complementary input signals according to one embodiment of the invention.

As depicted, at time $T_1$, OUT may be a low logic level and bOUT may be a high logic level. Also at time $T_1$, a rising edge crossing point of CLKC/bCLKC may be detected when CLKC$_E$ transitions from low to high. When CLKC$_E$ transitions from low to high, the NpathR signal may be raised (closing switches SR 616$_1$, 616$_2$) and the NpathLTH signal may be lowered (opening switches SLTH 618$_1$, 618$_2$).

Later, at time $T_2$, CLKC may transition from low to high. When CLKC transitions from low to high at time $T_2$, OUT may be driven to a high logic level and bOUT may be pulled to a low logic level by the differential amplifier formed by NMOS transistors 604, 610.

Then, at time $T_3$, bCLKC$_L$ may transition from high to low. When bCLKC$_L$ transitions from high to low, the NpathR signal may be lowered (opening switches SR 616$_1$, 616$_2$) and the NpathLTH signal may be raised (closing switches SLTH 618$_1$, 618$_2$). When the NpathLTH signal is raised, the complementary output values OUT/bOUT may be stored and maintained by the latch formed by NMOS transistors 606, 608.

Later, at time $T_4$, a rising edge crossing point of CLKT/bCLKT may be detected when CLKT$_E$ transitions from low to high. When CLKT$_E$ transitions from low to high, the NpathF signal may be raised (closing switches SF 614$_1$, 614$_2$) and the NpathLTH signal may be lowered (opening switches SLTH 618$_1$, 618$_2$).

Then, at time $T_5$, CLKT may transition from low to high. When CLKT transitions from low to high at time $T_5$, OUT may be pulled to a low logic level and bOUT may be driven to a high logic level by the differential amplifier formed by NMOS transistors 602, 604.

Later, at time $T_6$, bCLKT$_L$ may transition from high to low. When bCLKT$_L$ transitions from high to low, the NpathF signal may be lowered (opening switches SF 614$_1$, 614$_2$) and the NpathLTH signal may be raised (closing switches SLTH 618$_1$, 618$_2$). When the NpathLTH signal is raised, the complementary output values OUT/bOUT may be stored and maintained by the latch formed by NMOS transistors 606, 608.

FURTHER EMBODIMENTS OF THE DIFFERENTIAL DUTY RESTORATION CIRCUIT

Figure 10:
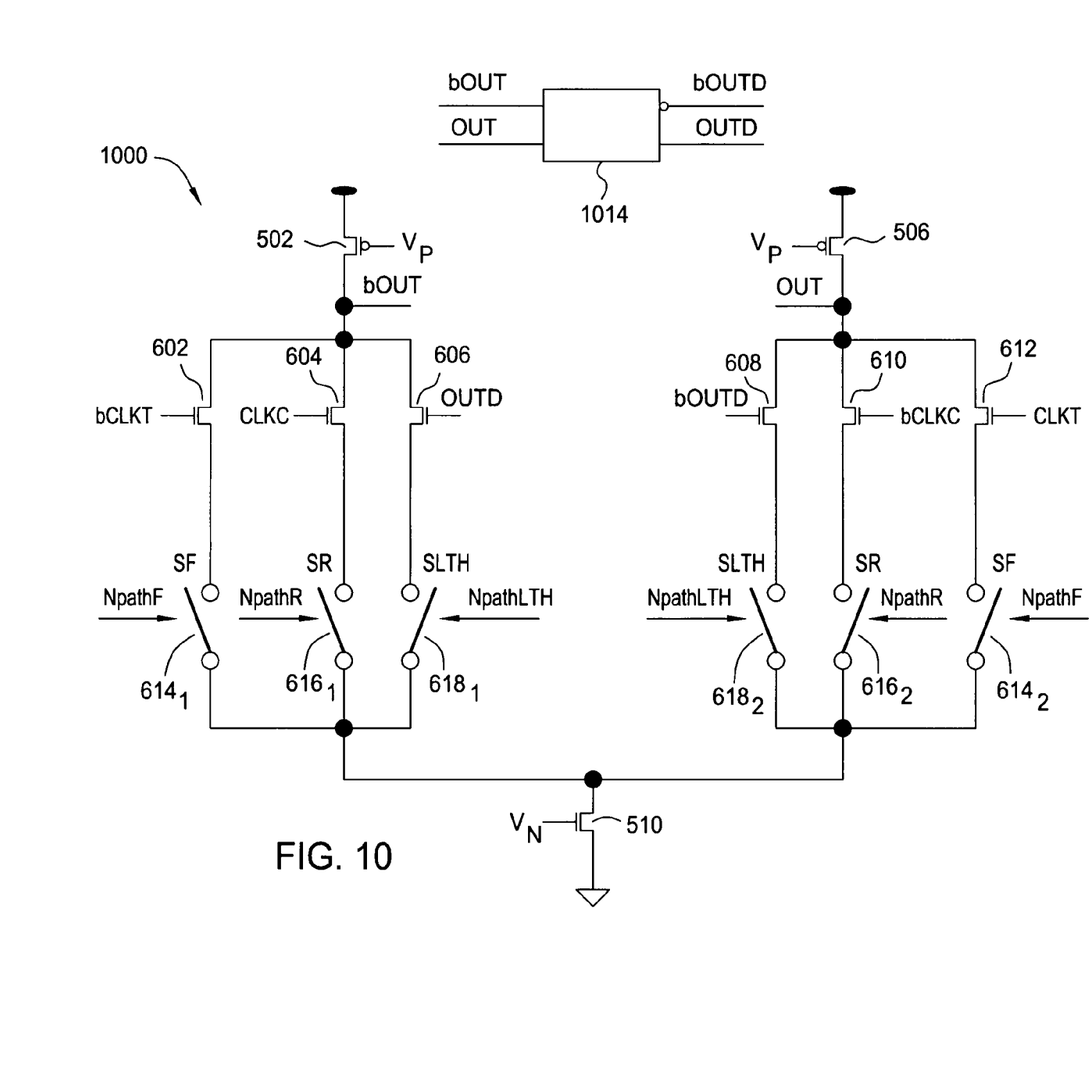
FIG. 10 is a circuit diagram depicting a duty restoration control circuit containing a differential delay element according to one embodiment of the invention.

According to one embodiment of the invention, the duty restoration control circuit 600 may contain additional circuitry which may be used to generate the complementary output signal OUT/bOUT. FIG. 10 is a circuit diagram depicting a duty restoration control circuit 1000 containing a differential delay element 1014 according to one embodiment of the invention. As depicted, the input to the differential delay element 1014 may be the complementary output signal OUT/bOUT and the output of the differential delay element 1014 may be a delayed version of OUT/bOUT referred to as OUTD/bOUTD.

As depicted, OUTD/bOUTD may be used to control NMOS transistors 606, 608 and thus control when the value of OUT/bOUT is latched. Because the signals OUTD/bOUTD are delayed, the latch formed by NMOS transistors 606, 608 depicted in FIG. 10 may latch the value of OUTD/bOUTD slightly later than if the latch were mere controlled by cross-coupled OUT/bOUT signals. Latching OUT/bOUT slightly layer may in some cases guarantee that the outputs being latched (OUT/bOUT) have reached a full level before being latched. In other words, latching OUT/bOUT with OUTD/bOUTD may ensure that the differential amplifier (either the first amplifier formed by NMOS transistors 602, 612 or the second amplifier formed by NMOS transistors 604, 610) driving OUT/bOUT as it is being latched has enough time to overwrite the previously stored values of OUT/bOUT before latching the new values.

With respect to the circuits depicted in FIG. 2 (and other figures), it is noted that each of the depicted circuits and the connections in between are merely exemplary. Those skilled in the art will recognize that embodiments of the invention may be used to effect with any arrangement or configuration of duty restoration circuit and/or delay-locked loop known to those skilled in the art.

With respect to FIG. 2, in some cases, the delay circuitry 214 may contain a phase blender circuit to make relatively small adjustments to the phase of DCLK/bDCLK and a coarse adjust circuit to make relatively large adjustments to the phase of DCLK/bDCLK. The coarse adjust circuit may contain several delay elements which may be selectively enabled (the combination of delay elements is referred to as a delay line). By varying the number of enabled delay elements, the coarse adjust circuit may make large incremental adjustments to the phase of DCLK/bDCLK. The combined adjustments of the coarse adjust circuit and the phase blender circuit may allow for large, accurate adjustments in the phase of the DCLK/bDCLK signal.

Also with respect to FIG. 2, in some cases, the feedback signal DCLK/bDCLK that is input into the phase detector 218 may differ from the signal which is fed back into the duty restoration circuitry 212. For instance, the feedback clock signal DCLK/bDCLK may be produced by a feedback delay in the delay circuitry 214 which may be inserted into the feedback loop to mimic any delay between the externally used complementary clock signals (EXT CLK and DQS) and the internal clock signals VCLK/bVCLK and DCLK/bDCLK created by the electrical connections and circuits external to the DLL circuit 200. By mimicking delays in such external circuitry, EXT CLK and DQS may be more accurately synchronized.

While the foregoing is directed to embodiments of the present invention, other and further embodiments of the invention may be devised without departing from the basic scope thereof, and the scope thereof is determined by the claims that follow.

What is claimed is:

1. A method of restoring a duty cycle of a complementary output signal pair, comprising:
   bringing the output signal pair in phase with a complementary input signal pair by delaying a complementary intermediate signal pair from which the output signal pair is generated;
   switching the intermediate signal pair to a first logic state in response to detecting a crossing point between rising and falling signals of the output signal pair; and
   switching the intermediate signal pair to a second logic state in response to detecting a crossing point between rising and falling signals of the input signal pair.

2. The method of claim 1, wherein switching the intermediate signal pair to the first logic state comprises:
   enabling a latch to store a state of a delayed version of the output signal pair, wherein the latch is enabled in conjunction with detecting a crossing point between rising and falling signals of a non-delayed version of the output signal pair.

3. The method of claim 2, further comprising:
   enabling a first differential amplifier to amplify the delayed version of the output signal pair, wherein the differential amplifier is enabled in conjunction with detecting the crossing point between the rising and falling signals of the non-delayed version of the output signal pair.

4. The method of claim 2, wherein switching the intermediate signal pair to the second logic state comprises:
   enabling the latch to store a state of a delayed version of the input signal pair, wherein the latch is enabled in conjunction with detecting a crossing point between the rising and falling signals of a non-delayed version of the input signal pair.

5. The method of claim 4, further comprising:
   enabling a second differential amplifier to amplify the delayed version of the input signal pair, wherein the differential amplifier is enabled in conjunction with detecting the crossing point between the rising and falling signals of the non-delayed version of the input signal pair.

6. The method of claim 1, further comprising:
   generating a delayed version of the intermediate signal pair; and
   cross-coupling the delayed version of the intermediate signal pair to a latch such that a time at which the intermediate signal pair is latched is delayed with respect to switching the intermediate signal pair to the first logic state and with respect to switching the intermediate signal pair to the second logic state.

7. A circuit, comprising:
   an adjustable delay circuit configured to generate a complementary output signal pair from a complementary intermediate signal pair by delaying the complementary intermediate signal pair;
   phase adjust circuitry configured to bring the output signal pair in phase with a complementary input signal pair by adjusting the delay of the adjustable delay circuit; and
   control circuitry configured to:
     switch the intermediate signal pair to a first logic state in response to detecting a crossing point between rising and falling signals of the output signal pair; and
     switch the intermediate signal pair to a second logic state in response to detecting a crossing point between rising and falling signals of the input signal pair.

8. The circuit of claim 7, further comprising:
   a latch, wherein the latch is enabled by the control circuitry to store a state of the output signal pair in conjunction with detecting a crossing point between rising and falling signals of a non-delayed version of the output signal pair.

9. The circuit of claim 8, further comprising:
a first differential amplifier, configured to amplify the output signal pair wherein the differential amplifier is enabled in conjunction with detecting the crossing point between the rising and falling signals of the non-delayed version of the output signal pair.

10. The circuit of claim 8, wherein the latch is enabled by the control circuitry to store a state of the input signal pair in conjunction with detecting a crossing point between rising and falling signals of a non-delayed version of the input signal pair.

11. The circuit of claim 10, further comprising:
a second differential amplifier configured to amplify the input signal pair, wherein the differential amplifier is enabled in conjunction with detecting the crossing point between the rising and falling signals of non-delayed version of the input signal pair.

12. The circuit of claim 7, further comprising:
delay circuitry configured to generate a delayed version of the intermediate signal pair, wherein the delayed version of the intermediate signal pair is cross-coupled to a latch such that a time at which the intermediate signal pair is latched is delayed with respect to switching the intermediate signal pair to the first logic state and with respect to switching the intermediate signal pair to the second logic state.

13. A circuit, comprising:
means for delaying configured to generate a complementary output signal pair from a complementary intermediate signal pair by delaying the complementary intermediate signal pair;
means for adjusting a phase configured to bring the output signal pair in phase with a complementary input signal pair by adjusting the delay of the means for delaying; and
means for controlling configured to:
switch the intermediate signal pair to a first logic state in response to detecting a crossing point between rising and falling signals of the output signal pair; and
switch the intermediate signal pair to a second logic state in response to detecting a crossing point between rising and falling signals of the input signal pair.

14. The circuit of claim 13, further comprising:
means for latching, wherein the means for latching is enabled in conjunction with detecting a crossing point between rising and falling signals of a non-delayed version of the output signal pair.

15. The circuit of claim 14, further comprising:
a first means for amplifying configured to amplify the output signal pair, wherein the first means for amplifying is enabled in conjunction with detecting the crossing point between the rising and falling signals of the non-delayed version of the output signal pair.

16. The circuit of claim 14, wherein the means for latching is enabled to store a state of the input signal pair in conjunction with detecting a crossing point between rising and falling signals of a non-delayed version of the input signal pair.

17. The circuit of claim 16, further comprising:
a second means for amplifying configured to amplify the input signal pair, wherein second means for amplifying is enabled in conjunction with detecting the crossing point between the rising and falling signals of the non-delayed version of the input signal pair.

18. A method for restoring the duty cycle of a complementary signal pair, comprising:
amplifying a first complementary signal pair with a first differential amplifier;
amplifying a second complementary signal pair with a second differential amplifier;
latching the amplified first complementary signal pair in conjunction with detecting a rising edge crossing point of a non-delayed version of the first complementary signal pair, wherein a high logic value and a low logic value are stored for a first and second signal of a complementary output signal pair, respectively; and
latching the amplified second complementary signal pair in conjunction with detecting a rising edge crossing point of a non-delayed version of the second complementary signal pair, wherein the high logic value is stored for the first signal and the low logic value is stored for the second signal.

19. The method of claim 18, further comprising:
enabling the first differential amplifier in conjunction with detecting the rising edge crossing point of the non-delayed version of the first complementary signal pair and disabling the first differential amplifier in conjunction with detecting a rising edge crossing point of a delayed version of the first complementary signal pair; and
enabling a second differential amplifier in conjunction with detecting the rising edge crossing point of the non-delayed version of the second complementary signal pair and disabling the second differential amplifier in conjunction with detecting a rising edge crossing point of a delayed version of the second complementary signal pair.

20. The method of claim 19, further comprising:
enabling a latch to store the complementary output signal pair in conjunction with detecting the rising edge crossing point of the non-delayed version of the first complementary signal pair and disabling the latch in conjunction with detecting the rising edge crossing point of the delayed version of the first complementary signal pair,
enabling the latch to store the complementary output signal pair in conjunction with detecting the rising edge crossing point of the non-delayed version of the second complementary signal pair and disabling the latch in conjunction with detecting the rising edge crossing point of the delayed version of the second complementary signal pair.

21. A differential duty restoration circuit comprising:
a first differential amplifier configured to amplify a first complementary signal pair in conjunction with detecting a rising edge crossing point of a non-delayed version of the first complementary signal pair;
a second differential amplifier configured to amplify a second complementary signal pair in conjunction with detecting a rising edge crossing point of a non-delayed version of the second complementary signal pair;
a latch configured to output a stored complementary output signal pair wherein the complementary output signal pair comprises a first output signal and a complement of the first output signal; and
control circuitry configured to:
enable the latch to store a complementary value pair output by the first differential amplifier, wherein a high logic value is stored for the first output signal and a low logic value is stored for the complement of the first output signal; and enable the latch to store a complementary value pair output by the second differential amplifier, wherein the low logic value is stored for the first output signal and the high logic value is stored for the complement of the first output signal.

22. The differential duty restoration circuit of claim 21, further comprising:

a first pair of switches configured to enable the first differential amplifier in conjunction with detecting the rising edge crossing point of the non-delayed version of the first complementary signal pair and disable the first differential amplifier in conjunction with detecting a rising edge crossing point of a delayed version of the first complementary signal pair; and a second pair of switches configured to enable the second differential amplifier in conjunction with detecting the rising edge crossing point of the non-delayed version of the second complementary signal pair and disable the second differential amplifier in conjunction with detecting a rising edge crossing point of a delayed version of the second complementary signal pair.

23. The differential duty restoration circuit of claim 22, further comprising a third pair of switches configured to:

enable the latch to store the complementary output signal pair in conjunction with detecting the rising edge crossing point of the non-delayed version of the first complementary signal pair and disable the latch in conjunction with detecting the rising edge crossing point of the delayed version of the first complementary signal pair;

enable the latch to store the complementary output signal pair in conjunction with detecting the rising edge crossing point of the non-delayed version of the second complementary signal pair and disable the latch in conjunction with detecting the rising edge crossing point of the delayed version of the second complementary signal pair.

24. The differential duty restoration circuit of claim 23, wherein each pair of switches comprises one or more transistors, and wherein each of the one or more transistors is a double-width transistor.

* * * * *